US 10,998,455 B2

(12) United States Patent
Le-Briz et al.

(10) Patent No.: US 10,998,455 B2
(45) Date of Patent: May 4, 2021

(54) LIGHT SENSOR

(71) Applicant: STMicroelectronics (Grenoble 2) SAS, Grenoble (FR)

(72) Inventors: Olivier Le-Briz, Saint-Gervais (FR); Laurent Mouche, Grenoble (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 0 days.

(21) Appl. No.: 16/665,119

(22) Filed: Oct. 28, 2019

(65) Prior Publication Data

US 2020/0135940 A1    Apr. 30, 2020

(30) Foreign Application Priority Data

Oct. 30, 2018   (FR) ...................... 1871336

(51) Int. Cl.
| | |
|---|---|
| *H01L 31/0216* | (2014.01) |
| *H01L 27/144* | (2006.01) |
| *H01L 27/146* | (2006.01) |
| *H01L 31/02* | (2006.01) |

(52) U.S. Cl.
CPC .... *H01L 31/02165* (2013.01); *H01L 27/1443* (2013.01); *H01L 27/14621* (2013.01); *H01L 27/14623* (2013.01); *H01L 27/14636* (2013.01); *H01L 27/14643* (2013.01); *H01L 27/14685* (2013.01); *H01L 31/02005* (2013.01); *H01L 31/02164* (2013.01)

(58) Field of Classification Search
CPC ......... H01L 31/02165; H01L 31/02164; H01L 27/14621; H01L 27/14623
See application file for complete search history.

(56) References Cited

U.S. PATENT DOCUMENTS

| | | | | |
|---|---|---|---|---|
| 4,354,104 A | * | 10/1982 | Chikamura | ....... H01L 27/14621 250/208.1 |
| 8,835,981 B2 | * | 9/2014 | Oishi | ................. H04N 9/04557 257/184 |
| 2005/0134788 A1 | | 6/2005 | Park | |
| 2007/0188635 A1 | | 8/2007 | Yamaguchi et al. | |
| 2010/0110271 A1 | * | 5/2010 | Yanagita | ........... H01L 27/14623 348/340 |
| 2010/0214453 A1 | * | 8/2010 | Murata | ............... H04N 9/04557 348/266 |

(Continued)

FOREIGN PATENT DOCUMENTS

JP    2005294647 A    10/2005

OTHER PUBLICATIONS

Coblentz, W "The Reflecting Power of Various Metals" The Jour. of Frank. Ins. Sep. 1910 pp. 197-225 (Year: 1910).*

(Continued)

*Primary Examiner* — Grant S Withers
(74) *Attorney, Agent, or Firm* — Crowe & Dunlevy

(57) ABSTRACT

A light sensor includes first and second neighboring photodiodes that are separated from each other by a space. A light-absorbing material is positioned at a location which is vertically above the space between the neighboring photodiodes. A first multilayer interference filter includes a central portion located vertically above the first photodiode and a peripheral portion that at least partly extends to rest on top of and in contact with the light-absorbing material.

24 Claims, 5 Drawing Sheets

(56) References Cited

U.S. PATENT DOCUMENTS

| | | | |
|---|---|---|---|
| 2013/0214160 A1* | 8/2013 | Cazaux | H01L 27/1464 |
| | | | 250/338.4 |
| 2014/0291793 A1* | 10/2014 | Tanaka | H01L 27/14621 |
| | | | 257/435 |
| 2016/0035775 A1* | 2/2016 | Choi | H01L 27/14636 |
| | | | 257/432 |
| 2016/0276396 A1 | 9/2016 | Tayanaka et al. | |

OTHER PUBLICATIONS

INPI Search Report and Written Opinion for FR 1871336 dated Jul. 3, 2019 (8 pages).

* cited by examiner

LIGHT SENSOR

PRIORITY CLAIM

This application claims the priority benefit of French Application for Patent No. 1871336, filed on Oct. 30, 2018, the content of which is hereby incorporated by reference in its entirety to the maximum extent allowable by law.

TECHNICAL FIELD

The present disclosure generally concerns electronic circuits, and more particularly light sensors, especially light sensors where different wavelength ranges of light are desired to be captured separately.

BACKGROUND

Light sensors where a first filter configured to pass a first wavelength range of light covers a first photodiode and a second filter configured to pass a second wavelength range of light covers a second photodiode, next to the first photodiode, are known.

When such a sensor receives light, the light crossing the first filter is intended to be captured or received by the first photodiode and the light crossing the second filter is intended to be captured or received by the second photodiode. Thus, the first and second photodiodes enable to separately measure the quantity of light received by the sensor, respectively in the first wavelength range and in the second wavelength range.

However, the light crossing the first filter may reach the second photodiode and/or the light crossing the second filter may reach the first photodiode, particularly according to the angle with which the light rays reach the sensor. Such a so-called crosstalk phenomenon raises an issue. Such a crosstalk issue also arises when the second photodiode is coated with no filter.

There is need to overcome all or part of the disadvantages of known light sensors, in particular all or part of the disadvantages associated with the crosstalk between neighboring photodiodes of the sensors.

SUMMARY

An embodiment overcomes all or part of the disadvantages of known light sensors, in particular light sensors provided to determine the quantity of light received in different wavelength ranges.

An embodiment provides a light sensor comprising: first and second neighboring photodiodes, separated from each other by a space; a light-absorbing material arranged at least vertically above said space; a first multilayer interference filter having a central portion vertically above the first photodiode and a peripheral portion at least partly resting on top of and in contact with light-absorbing said material.

According to an embodiment, the light-absorbing material is black-colored, the light-absorbing material preferably being a black resin.

According to an embodiment, the light-absorbing material absorbs at least 50%, preferably at least 75%, or even at least 95% of the light power received for wavelengths in the range from 300 nm to 3 µm.

According to an embodiment, the sensor comprises a second multilayer interference filter having a central portion vertically above the second photodiode and a peripheral portion at least partly resting on top of and in contact with the light-absorbing material.

According to an embodiment, the peripheral portions of the first and second filters overlap above said light-absorbing material.

According to an embodiment, the first filter is configured to pass light in a first wavelength range, the second filter being configured to pass light in a second wavelength range different from the first one.

According to an embodiment, the central portion of each filter rests on a surface of the sensor intended to receive light, the photodiodes being arranged under this surface.

According to an embodiment, the light-absorbing material rests on said surface.

According to an embodiment, the light-absorbing material is flush with said surface.

According to an embodiment, the sensor comprises a semiconductor substrate having the photodiodes arranged therein, and an interconnection structure resting on said substrate, said surface being on the side of the interconnection structure opposite to the substrate.

According to an embodiment, the interconnection structure comprises a metal plate extending at least under the entire light-absorbing material, preferably in contact with the light-absorbing material.

According to an embodiment, the metal plate comprises an opening vertically above each of the first and second photodiodes.

According to an embodiment, each of the first and second photodiodes of the sensor is surrounded with a ring of said light-absorbing material.

Another embodiment provides a method of manufacturing a sensor such as described here above, comprising the successive steps of: a) forming said light-absorbing material; and b) forming said first filter.

According to an embodiment, the method further comprises, after step b), a step c) of forming said second filter.

BRIEF DESCRIPTION OF THE DRAWINGS

The foregoing and other features and advantages will be discussed in detail in the following non-limiting description of specific embodiments in connection with the accompanying drawings, wherein.

DETAILED DESCRIPTION

Figure 1:
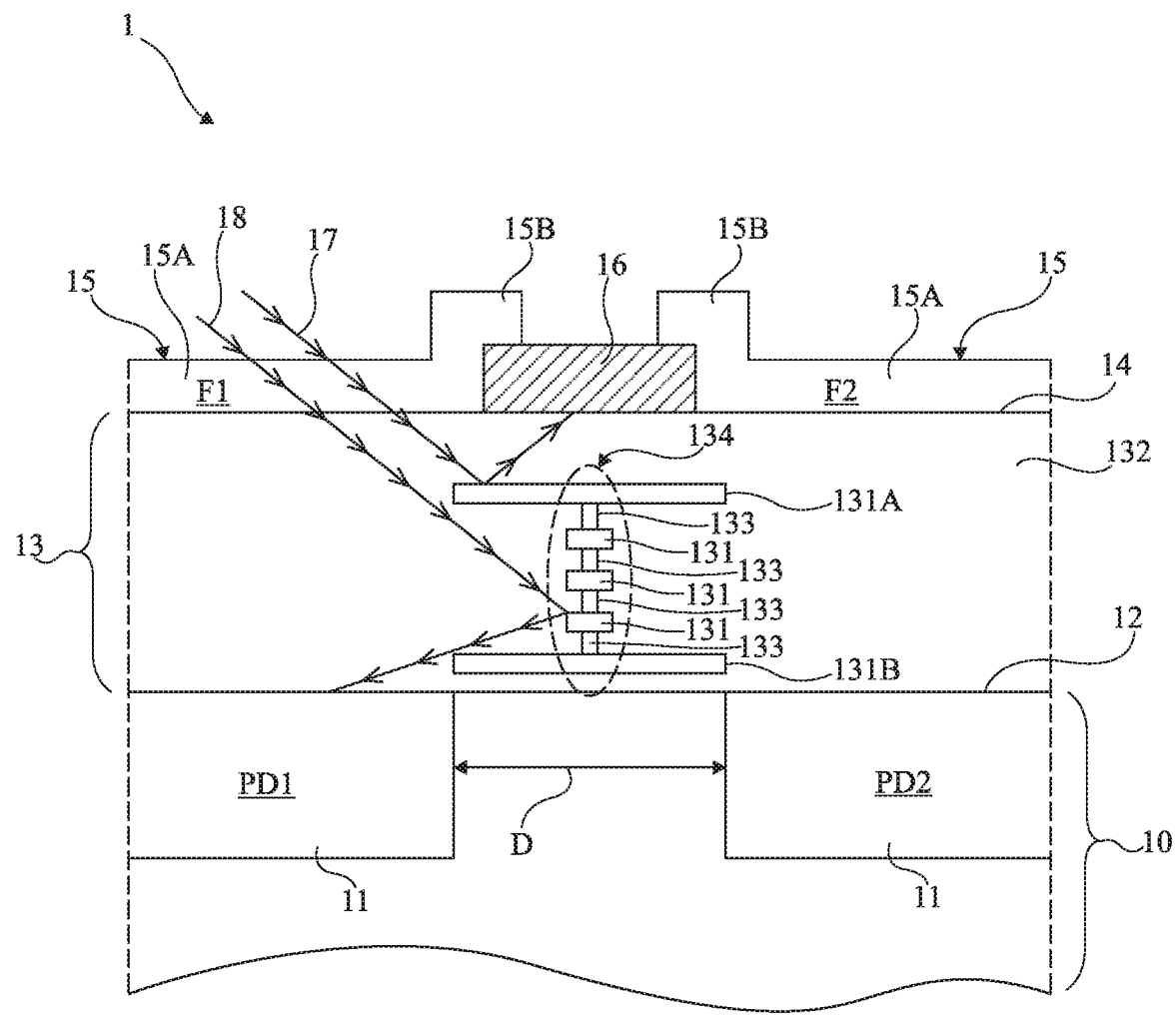
FIG. 1 is a simplified cross-section view of an embodiment of a light sensor.

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed. In particular, the various components (photodiodes, readout circuits, processing circuits, etc.) of a light sensor have not been detailed, the described embodiments being compatible with usual light sensors.

Throughout the present disclosure, the term "connected" is used to designate a direct electrical connection between circuit elements with no intermediate elements other than conductors, whereas the term "coupled" is used to designate an electrical connection between circuit elements that may be direct, or may be via one or more intermediate elements.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., unless otherwise specified, it is referred to the orientation of the drawings.

The terms "about", "substantially", and "approximately" are used herein to designate a tolerance of plus or minus 10%, preferably of plus or minus 5%, of the value in question.

In the following description, the term light means a light radiation having its wavelength(s) in the range from approximately 300 nm to approximately 3 µm, preferably from 300 nm to 3 µm. In other words, the light here corresponds to light in the UVA (Ultra-Violet A) range, in the visible range, and/or in the near infrared range.

In the following description, an element is called light-absorbing in a given wavelength range if, at such wavelengths, this element absorbs at least 50%, for example, at least 60%, preferably at least 75%, and more preferably still at least 95% (strong absorption) of the light power that it receives. Further, an element is called light-reflecting in a given wavelength range if, at such wavelengths, the element reflects at least 50%, for example, at least 60%, preferably at least 75%, of the light power that it receives. It should be noted that when an unwanted reflection of light or, in other words, a parasitic reflection of light, is concerned, a material is called reflective for a given wavelength range as soon as it reflects a few percent, for example, at least 5%, of the light power that it receives in this wavelength range.

FIG. 1 is a simplified cross-section view of an embodiment of a light sensor 1, and more particularly of a portion of sensor 1. As an example, sensor 1 is an image sensor used to capture an image of a scene, or an ambient light sensor used to measure the light intensity of the light received by the sensor. Color image sensors and multispectral ambient light sensors, the latter enabling to measure the light intensity in different given wavelength ranges, are here more particularly considered.

Sensor 1 comprises a semiconductor substrate 10, for example, made of silicon, having a plurality of photodiodes 11 arranged therein, a photodiode 11 PD1 and a photodiode 11 PD2 being shown in FIG. 1. Photodiodes 11 extend depthwise in substrate 10 from an upper surface 12 of substrate 10 intended to receive light. Photodiodes 11 extend depthwise in substrate 10 across all or part of its thickness. Each photodiode 11 is separated from the neighboring or adjacent photodiode(s) 11 by a space D, as shown in FIG. 1 where neighboring photodiodes PD1 and PD2 are laterally separated from each other by a space D. Preferably, the width of space D between two neighboring photodiodes 11, measured between the lateral surfaces of these photodiodes which are opposite one another, is substantially constant, for example, constant. In top view, not shown, when sensor 1 comprises a plurality of photodiodes 11 arranged in an array comprising rows and columns of photodiodes 11, the spaces D between photodiodes 11 form a grid laterally delimiting photodiodes 11.

The space D between two neighboring photodiodes, for example, corresponds to a portion of substrate 10 and/or to an insulation structure (not shown in FIG. 1). As an example, the width of space D between two neighboring photodiodes is in the range from 100 nm to 30 µm. For example, for a sensor having pixels with a surface area in the order of 2 µm*2 µm, typically an image sensor, width D is, for example, in the range from 100 to 300 nm, preferably in the order of 200 nm. For example, for a sensor having photodiodes with a surface area intended to receive light in the order of 50 µm*50 µm, typically an ambient light sensor, the width of space D is, for example, in the range from 20 to 30 µm. Preferably, the width of space D is substantially constant, or constant, for each two neighboring photodiodes 11 of sensor 1.

As an example, an insulation structure between two neighboring photodiodes 11 may be a deep trench insulation extending in the substrate, the trench being filled with one or a plurality of insulating materials, such as silicon oxide and/or silicon nitride, of an electrically-conductive material which may or not be intended to be biased, of a material reflecting light at the operating wavelengths of the sensor and/or of a material absorbing light at the operating wavelengths of the sensor. A specific example of an insulation structure is a trench of capacitive deep trench insulation (CDTI) filled with an electrically-conductive material and with an electrically-insulating layer separating the conductive material from substrate 10.

In the embodiment described in relation with FIG. 1, sensor 1 is of front side illumination (FSI) type, that is, the surface 12 of substrate 10 intended to receive light is coated with an interconnection structure 13. Interconnection structure 13 comprises metal levels each formed of portions of metal layers 131 embedded in insulating layers 132 (not detailed in FIG. 1). Portions of layers 131 of different metal levels are coupled together by electrically-conductive vias 133 crossing insulating layers 132. The interconnection structure electrically couples components formed at the level of surface 12 of substrate 10, together and/or to connection pads, for example, arranged on interconnection structure 13.

In this embodiment, a surface 14 of sensor 1 intended to receive light, in this example upper surface 14 of interconnection structure 13, is coated with multilayer interference filters 15 and with a material 16 absorbing light, for example, a black-colored material, preferably black resin. Preferably, material 16 absorbs at least 95% of the light power that it receives for wavelengths in the range from 300 nm to 3 µm.

Black resin 16 rests on top of and in contact with surface 14, and more specifically, on top of and in contact with portions of surface 14 at a location which is vertically above (in a direction perpendicular to surface 12) spaces D between photodiodes 11 of the sensor. Thus, in top view, at least certain photodiodes 11, for example, the two neighboring photodiodes PD1 and PD2, and preferably all the photodiodes of sensor 1, are each surrounded with a resin ring 16. Preferably, in the case of a sensor 1 comprising an array of photodiodes 11 organized in rows and in columns, in top view, not shown, resin 16 forms a barrier between the photodiodes, the ring surrounding a photodiode arranged on a side of the array being capable of being interrupted, for example, at the level of the edge of the array. Preferably, the width of the black resin 16 arranged vertically above space D between two neighboring photodiodes 11 is equal to or smaller than that of space D. In other words, each portion of surface 14 located vertically above a photodiode 11 is deprived of black resin 16.

The photodiodes 11 of sensor 1, for example, at least two neighboring photodiodes 11, preferably all the photodiodes 11 of sensor 1, are each topped with a multilayer interference filter 15. In the example of FIG. 1, photodiode PD1 is topped with a filter 15 F1, and photodiode PD2 is topped with a filter 15 F2. Each filter 15 comprises a stack of dielectric and/or metal layers. The material and the thickness of each layer are selected so that the filter passes light for a given wavelength range and reflects all or part of the light for the other wavelengths. In the example of FIG. 1, filter F1 is designed to pass light in a first wavelength range, filter F2 being designed to pass light in a second wavelength range different from the first range, where the first and second ranges may overlap.

Each filter 15 rests on top of and in contact with surface 14, at least on top of and in contact with the entire portion of surface 14 located vertically above the photodiode 11 above-which it is positioned. Furthermore, filter 15 extends on top of the black resin 16 which surrounds photodiode 11. In other words, each filter 15 comprises, on the one hand, a central portion 15A arranged on top of and in contact with the portion of surface 14 located vertically above the entire surface of photodiode 11 coated with the filter and, on the other hand, a peripheral portion 15B resting on top of and in contact with the black resin 16 which surrounds photodiode 11. Preferably, central portion 15A of filter 15 rests on top of and in contact with the entire portion of surface 14 delimited by the black resin ring 16 which surrounds photodiode 11 coated with filter 15, peripheral portion 15B of filter 15 being preferably annular and resting on top of and in contact with the black resin ring 16 surrounding photodiode 11.

In this embodiment, the peripheral portion 15B of filter 15 topping a first photodiode 11 is not in contact with the peripheral portion 15B of filter 15 topping a second photodiode 11 next to the first one. Thus, in FIG. 1, peripheral portions 15B of filters F1 and F2 are not in contact, and a portion of resin 16 extending between peripheral portions 15B is not covered with filters F1 and F2.

In the embodiment of FIG. 1, it is preferably provided for interconnection structure 13 to comprise, above space D between two neighboring photodiodes 11, for example, photodiodes PD1 and PD2, a vertical structure 134 formed by a stack of portions of conductive layers 131 and of conductive vias 133. Vertical structure 134 extends vertically between a portion of interconnection structure 13 arranged above a photodiode 11, for example, photodiode PD1, and a portion of structure 13 arranged above a neighboring photodiode 11, for example, photodiode PD2. In this example, structure 134 substantially has the shape of a wall.

In this embodiment, it is preferably provided for interconnection structure 13 to comprise a metal layer portion 131, or metal plate 131A, extending under all the black resin 16. Preferably, metal plate 131A is located vertically above at least the entire surface of spaces D between neighboring photodiodes 11. Preferably, in top view, metal plate 131A forms for at least certain photodiodes 11, for example, the two neighboring photodiodes PD1 and PD2, and preferably for all the photodiodes of sensor 1, metal rings each surrounding a corresponding photodiode 11. Preferably, in the case of a sensor 1 comprising an array of photodiodes 11 organized in rows and in columns, in top view not shown, metal plate 131A forms a barrier between the photodiodes, the metal ring surrounding a photodiode arranged on an edge of the array which may be interrupted, for example, at the level of the edge of the array. As an example, as shown in FIG. 1, the edges of plate 131A are vertically in line with the lateral edges of photodiodes 11.

As a variation, plate 131A further extends above photodiodes 11 or, in other words, the edges of plate 131A are vertically in line with the surfaces of photodiodes 11.

Metal plate 131A is preferably provided in the upper metal level of structure 13, that is, the metal level closest to surface 14 of the sensor. In this case, plate 131A substantially delimits, for each photodiode 11, the light reception surface intended for this photodiode.

As shown in FIG. 1, it may further be provided for more than one metal level of structure 13 to comprise a metal plate 131 similar to metal plate 131A. In the example of FIG. 1 where metal plate 131A is arranged in the upper metal level, a layer portion 131, or metal plate 131B, similar to metal plate 131A is arranged in the lower metal level of structure 13. In this case, metal plate 131B substantially delimits, for each photodiode 11, the portion of the surface of photodiode 11 that receives light.

In the example of FIG. 1, each wall 134 comprises a portion of plate 131A at its top, and a portion of plate 131B at its base.

In operation, light is received by sensor 1, on the side of its surface 14. A light ray 17 having crossed one of filters 15, for example, filter F1, may be totally or partly reflected by the various layers arranged under surface 14, for example, by metal plate 131A, towards a neighboring filter 15, for example, filter F2. In this case, it is absorbed by black resin 16, which decreases, or even suppresses, the crosstalk in sensor 1.

It could have been devised to omit black resin 16 and to extend the neighboring filters F1 and F2 until they are in contact, or even overlap. However, ray 17 could then have undergone a plurality of parasitic reflections successively on plate 131A and on filter F2 to reach photodiode PD2.

It could also have been devised to omit black resin 16 and to leave a space between filters F1 and F2, however, light reaching surface 14 between filters F1 and F2 could then have undergone a plurality of parasitic reflections successively on plate 131A and on a neighboring filter 15, for example, filter F2 in the case of light originating from the left in FIG. 1, and reach the photodiode 11 arranged under this filter, in this example, photodiode PD2.

It could also have been devised to deposit black resin 16 so that it covers the entire space between filters F1 and F2, but also so that, to ensure the optical isolation between neighboring photodiodes, black resin 16 further extends over filters F1 and F2. However, this could have led to partially covering the surface of photodiodes PD1 and PD2 with black resin, which would have caused a decrease in the surface area of the photodiode which may effectively receive light, and thus a decrease in the efficiency of sensor 1.

In this embodiment where sensor 1 is front-side illuminated, a light ray 18 crossing one of filters 15, for example, filter F1 covering photodiode PD1, and propagating in the interconnection structure towards the neighboring photodiode 11, in this example, photodiode PD2, is at least partly reflected by structure or wall 134, which further decreases, or even suppresses, the crosstalk in sensor 1.

Figure 2:
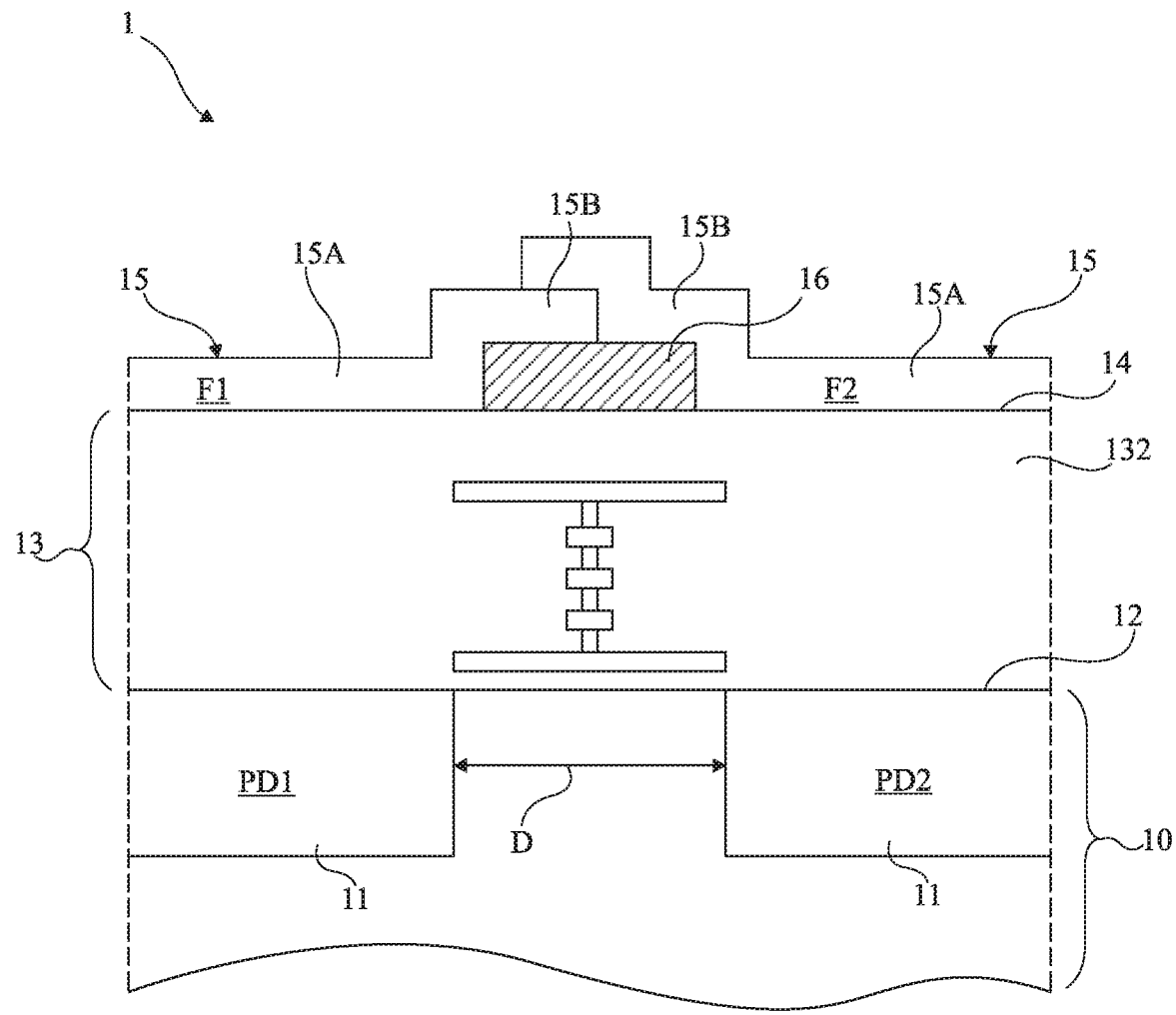
FIG. 2 is a simplified cross-section view of an alternative embodiment of the sensor of FIG. 1.

FIG. 2 is a simplified cross-section view of an alternative embodiment of the sensor of FIG. 1.

Sensor 1 of FIG. 2 comprises all the elements of sensor 1 of FIG. 1, but differs therefrom by the fact that the filters 15 over two neighboring photodiodes 11, for example, filters F1 and F2, overlap, the overlapping area of filters F1 and F2 being vertically above (in a directed perpendicular to surface 12) a top surface of a portion of black resin 16. More particularly, the overlapping portions of the filters are peripheral portions 15B.

The overlapping of filters 15 above resin 16 enables to decrease the constraints of alignment of filters 15 and of resin 16 on manufacturing of sensor 1. Such an overlapping of filters 15 above resin 16 also enables to decrease the width of black resin 16 between two neighboring photodiodes without increasing the crosstalk, which is particularly advantageous when the width of spaces D between neighboring photodiodes is desired to be decreased.

Figure 3:
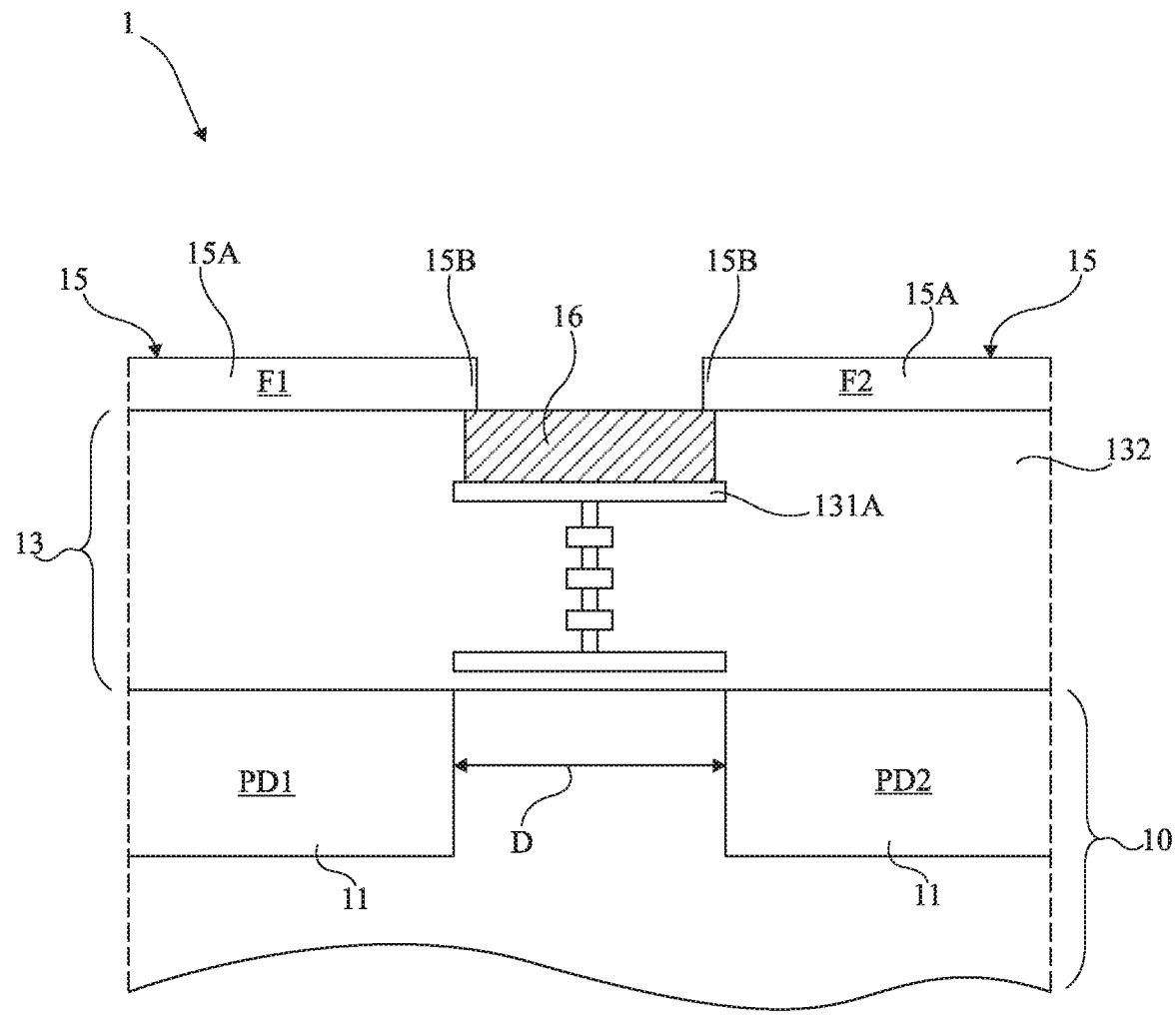
FIG. 3 is a simplified cross-section view of another alternative embodiment of the sensor of FIG. 1.

FIG. 3 is a simplified cross-section view of another alternative embodiment of the sensor of FIG. 1.

The sensor 1 of FIG. 3 comprises all the elements of the sensor 1 of FIG. 1 but differs therefrom by the fact that black resin 16 is arranged in a cavity extending depthwise from surface 14 instead of resting on surface 14. Such a configuration of sensor 1 enables to further decrease the crosstalk with respect to the configurations of sensor 1 described in relation with FIGS. 1 and 2.

Preferably, resin 16 fills the cavity, and the upper surface level of resin 16 is equal or substantially equal to that of surface 14, the assembly of surface 14 and of black resin 16 then having a planar or substantially planar upper surface having filters 15 F1 and F2 resting thereon. The provision of such a planar upper surface makes the manufacturing of filters F1 and F2 simpler, and enables to obtain a sensor 1 having a more planar upper surface.

Preferably, black resin 16 extends all the way to metal plate 131A, which enables to further decrease the crosstalk. In such a configuration, the edges of black resin 16 are preferably recessed with respect to the edges of plate 131A, which may enable to simplify the method of manufacturing sensor 1 by using plate 131A as an etch stop layer of the cavity.

In other examples, not illustrated, the edges of black resin 16 may be aligned with the edges of plate 131A and/or the upper surface of black resin 16 may be under or above the level of surface 14.

The alternative embodiment of FIG. 2 where filters F1 and F2 overlap above black resin 16 may be combined with the alternative embodiment of FIG. 3.

Further, other alternative embodiments are possible. In particular, in an alternative embodiment, not shown, filter F2 is omitted or is a usual absorbing filter such as a colored resin filter.

In another variation, not illustrated, sensor 1 further comprises photodiodes PD1 and PD2 coated with multilayer interference filters F1 and F2, a photodiode coated with an additional multilayer interference filter different from filters F1 and F2. Such an additional filter is then arranged with respect to black resin 16, to filters F1 and F2, and to the photodiode that it covers similarly to what has been described for filters F1 and F2.

In another variation, not illustrated, sensor 1 further comprises photodiodes PD1 and PD2 coated with multilayer interference filters F1 and F2, a photodiode coated with a usual absorbing filter. Such an absorbing filter is then arranged with respect to black resin 16, to filters F1 and F2, and to the photodiode that it covers similarly to what has been described for filters F1 and F2.

In another alternative embodiment, not illustrated, sensor 1 further comprises photodiodes PD1 and PD2 coated with multilayer interference filters F1 and F2, a photodiode which is not coated with a filter.

The above last three variations can be combined.

The above variations may be combined with the alternative embodiment where the black resin is arranged in a cavity extending from surface 14, and/or, in the case where the sensor comprises at least two different filters, with the alternative embodiment where the filters overlap above black resin 16.

More generally, the structures corresponding to the various embodiments and alternative embodiments described hereabove in relation with FIGS. 1 to 3 may be repeated a plurality of times in a sensor.

Figure 4A:
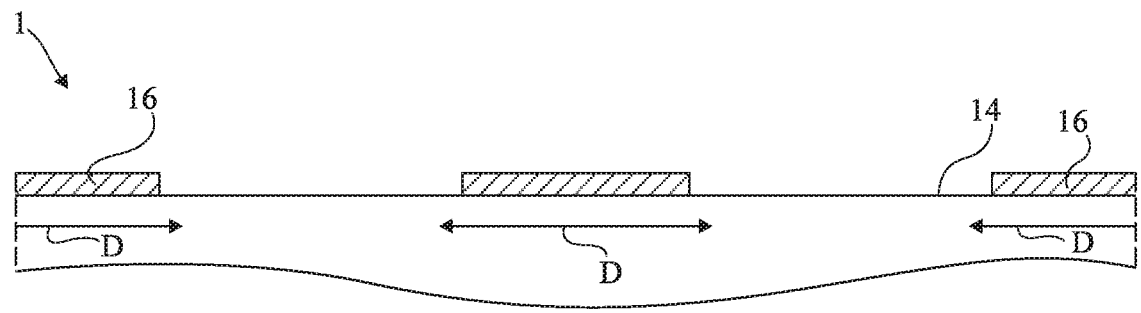
FIGS. 4A-4C show partial simplified cross section views illustrating successive steps of an embodiment of a method of manufacturing a sensor of the type in FIG. 1 or 2.
Figure 4B:
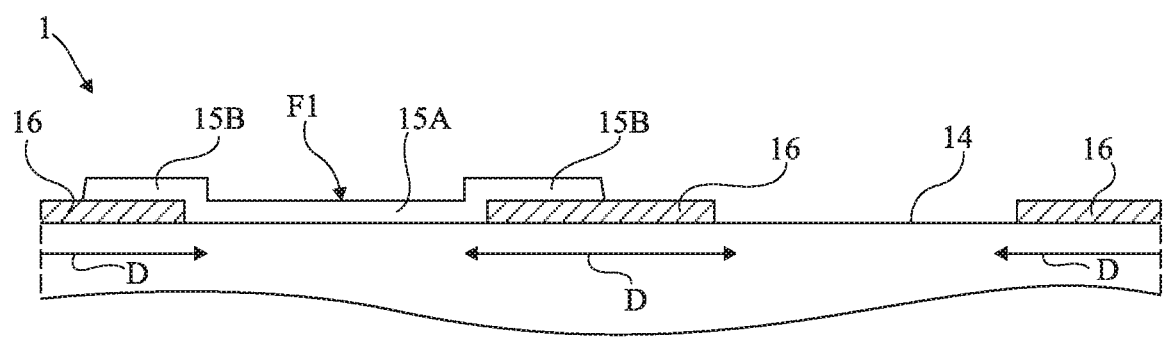
Figure 4C:
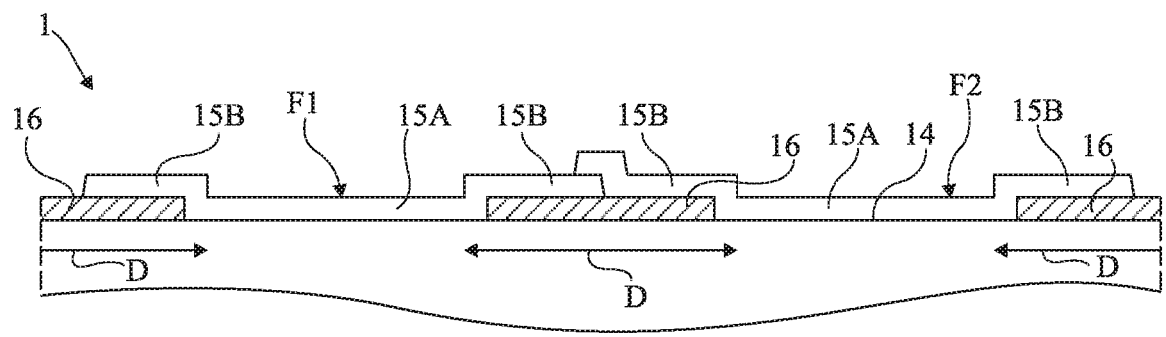

FIGS. 4A-4C show simplified cross-section views illustrating successive steps of an embodiment of a method of manufacturing a sensor of the type of that in FIG. 1 or 2. In FIGS. 4A-4C, only the surface 14 of sensor 1, black resin 16, and filters F1 and F2, have been shown.

FIG. 4A shows sensor 1 after a step of forming black resin 16 on surface 14, above spaces D separating from one another the photodiodes of sensor 1. Resin 16 is formed to have, with respect to spaces D, the layout described in relation with FIG. 1. Due to the fact that it is not necessary for the edges of resin 16 to be vertically in line with the edges of spaces D, the alignment constraints of the masks used to form resin 16 are released.

As an example, resin 16 is deposited in the form of a layer totally covering surface 14, after which portions of black resin 16 are removed so that the black resin left in place has the desired configuration.

Still as an example, resin 16 may be formed with the desired configuration by a lift-off method, for example comprising the steps comprising depositing a masking layer, for example, made of resin, over the entire surface 14, forming through openings in the masking layer at the locations where black resin 16 is desired to be left in place, depositing black resin 16 over the entire structure, and removing the masking layer, which then takes away with it the black resin portions resting on top of and in contact with the masking layer so that black resin 16 only remains at the desired locations.

Preferably, on implementation of a removal method, it is provided for each opening in the masking layer to be formed so that its lateral walls are inclined upwards and towards the inside of the opening. This enables to limit the deposition of black resin 16 on the lateral walls, which simplifies the removal of the masking layer and of the black resin portions resting on top of and in contact with the masking layer.

FIG. 4B shows the structure of FIG. 4A after a step of forming a filter 15, in this example, filter F1, on surface 14 and black resin 16. A central portion 15A of filter F1, resting on surface 14, is located vertically above the entire surface of the photodiode 11 (not shown) that it coats, and a peripheral portion 15B of filter F1 rests on top of and in contact with black resin 16, in the way described in relation with FIG. 1.

As an example, filter F1 is formed by successive steps of depositing the layers forming the filter and then of etching the portions of these layers at the locations which are desired to comprise no filter F1.

Still as an example, filter F1 is formed by a lift off method similar to that described as an example in relation with FIG. 4A. In the specific case where filter F1 is formed by a lift-off method where each opening in the masking layer has walls inclined upwards and towards the inside of the opening, the material(s) forming the filter may extend beyond the lateral edge of the filter. Such an extension, typically tapered, is not considered as forming part of the filter, particularly due to the fact that its optical properties are not those expected due to the thickness variation of this extension.

FIG. 4C shows the structure of FIG. 4B after a step of forming another filter 15, in this example, filter F2, on top of and in contact with surface 14 and black resin 16. A central portion 15A of filter F2, resting on top of and in contact with surface 14, is located vertically above the entire surface of the photodiode 11 (not shown) that it coats, and a peripheral portion 15B of filter F2 rests on top of and in contact with black resin 16. Further, in this embodiment, the dimensions of filters F1 and F2 are such that filters F1 and F2 overlap, above black resin 16, as described in relation with FIG. 2.

In an alternative embodiment, not shown, the lateral dimensions of filters F1 and F2 are such that their peripheral portions 15B rest on top of and in contact with black resin 16 but do not overlap. In this variation, filters F1 and F2 may possibly be in contact at the level of their edges.

As an example, filter F2 may be formed by one of the methods described as an example in relation with FIG. 4B, for example, with the same method as that used to form filter F1.

The method described here above in relation with FIGS. 4A-4B may be generalized to the case where it is provided to form other filters, different from filters F1 and F2, adapted to still one or a plurality of other given wavelength ranges or, conversely, to the case where filter F2 is omitted by suppressing the step of FIG. 4C.

Furthermore, in the method described hereabove in relation with FIGS. 4A-4C, each time a filter 15 designed for a given wavelength range is formed, a plurality of identical filters may be simultaneously formed on surface 14, each of these identical filters being formed vertically above a different photodiode 11.

Further, the steps of the method described hereabove in relation with FIGS. 4A-4C may be simultaneously implemented for a plurality of sensors 1 of a same semiconductor wafer, before the sensors are individualized, for example, by sawing of the semiconductor wafer. In this case, each deposition of a layer preferably corresponds to a full plate deposition.

Figure 5:
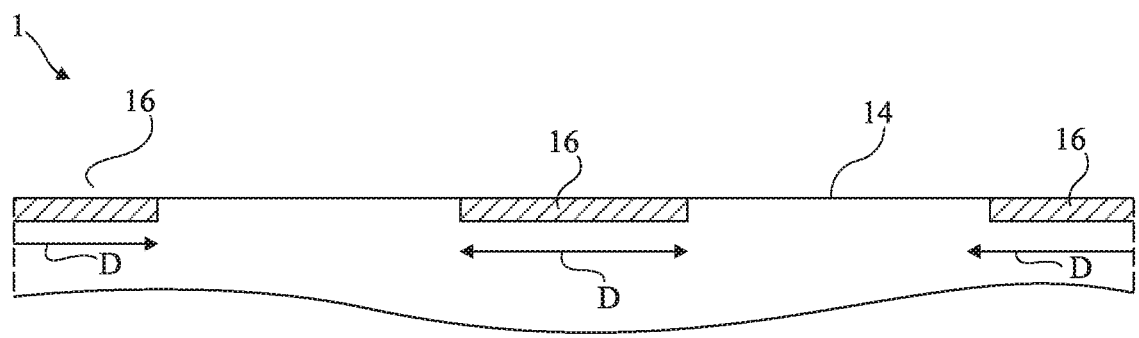
FIG. 5 is a simplified cross-section view illustrating an alternative embodiment of a step of the method of FIGS. 4A-4C in the case where the manufactured sensor is of the type in FIG. 3.

FIG. 5 is a simplified cross-section view illustrating an alternative embodiment of the step of FIG. 4A of the manufacturing method described in relation with FIGS. 4A-4C. In this alternative embodiment, the manufactured sensor 1 is of the type in FIG. 3.

Thus, FIG. 5 shows sensor 1 after a step of forming black resin 16 so that resin 16 fills a cavity extending depthwise from surface 14.

As an example, resin 16 is deposited in a cavity etched from surface 14. In this case, resin 16 may be deposited full plate in the form of a layer having portions outside of the cavity which are then removed, for example by etching, by photolithography, by lift-off, or by chemical mechanical planarization (CMP). According to the removal method used and to the thickness of the deposited layer of black resin 16, the upper surface of black resin 16 left in place in the cavity may be under, above, or at the same level as surface 14.

Preferably, although this is not shown herein, the cavity is etched all the way to plate 131A, the etching being stopped on the metal of plate 131A. Thus, in the case where, to expose electric connection pads (not illustrated) formed in the upper metal level of the interconnection structure, a step of etching the insulating layers of the structure all the way to the upper metal level is provided, such a step may also be used to etch the cavity.

Although this is not illustrated, after the step illustrated by FIG. 5, the steps described in relation with FIGS. 4B and 4C are implemented, to manufacture a sensor 1 of the type in FIG. 3.

The case of a light sensor comprising photodiodes separated two by two by a space having black resin arranged vertically above and in front of it, the sensor further comprising a first multilayer interference filter F1 15 having a central portion 15A vertically above a first photodiode PD1 11 and a peripheral portion 15B at least partly resting on top of and in contact with black resin 16, has been described up to now. However, the embodiments and variations described in relation with FIGS. 1 to 5 apply to the case where black resin 16 is replaced with any other material absorbing light, preferably in a wavelength range from approximately 300 nm to approximately 3 μm, for example, between 300 nm and 3 μm. As an example, black resin 16 may be replaced with a composite, monolayer, or multiple-layer absorbing material, such as a stack of metal, of silicon oxide, and of metal oxide.

Various embodiments and variations have been described. It will be understood by those skilled in the art that certain features of these various embodiments and variations may be combined, and other variations will occur to those skilled in the art. In particular, it is within the abilities of those skilled in the art to form filters 15 and the absorbing material by other methods than those indicated as an example in relation with FIGS. 4A-4C. Further, although a structure of filters 15 and of absorbing material 16 resting on surface 14 of a front-side illuminated sensor 1 has been described, the sensor may be back-side illuminated (BSI), surface 14 of sensor 1 then corresponding to a surface arranged on the side of substrate 10 opposite to interconnection structure 13.

Finally, the practical implementation of the described embodiments and variations is within the abilities of those skilled in the art based on the functional indications given here above. In particular, it is within the abilities of those skilled in the art to determine the thicknesses, the number, and/or the materials of the layers forming a multilayer interference filter according to the wavelength ranges for which the filter should respectively pass or reflect light.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A light sensor, comprising:
    a first photodiode;
    a second photodiode which is neighboring the first photodiode, wherein the first and second photodiodes are separated from each other by a space;
    a semiconductor substrate having the first and second photodiodes arranged therein;
    an interconnection structure resting on said semiconductor substrate;
    a light-absorbing material positioned vertically above said space;
    a first multilayer interference filter having a first central portion positioned vertically above the first photodiode and a first peripheral portion positioned vertically above said space and at least partly resting on top of and in contact with said light-absorbing material;
    wherein the first central portion of the first multilayer interference filter rests on a surface of the light sensor intended to receive light, the first photodiode being arranged under said surface;

wherein said surface is on a side of the interconnection structure opposite to the semiconductor substrate; and wherein the interconnection structure comprises a metal plate extending at least under the entire light-absorbing material.

2. The sensor of claim 1, wherein the light-absorbing material is black-colored.

3. The sensor of claim 1, wherein the light-absorbing material is a black resin.

4. The sensor of claim 1, wherein the light-absorbing material absorbs at least 50% of the light power received for wavelengths in the range from 300 nm to 3 µm.

5. The sensor of claim 1, wherein the light-absorbing material absorbs at least 75% the light power received for wavelengths in the range from 300 nm to 3 µm.

6. The sensor of claim 1, wherein the light-absorbing material absorbs at least 95% of the light power received for wavelengths in the range from 300 nm to 3 µm.

7. The sensor of claim 1, further comprising a second multilayer interference filter having a second central portion vertically above the second photodiode and a second peripheral portion at least partly resting on top of and in contact with the light-absorbing material.

8. The sensor of claim 7, wherein the first and second peripheral portions of the first and second filters, respectively, overlap vertically above said light-absorbing material.

9. The sensor of claim 7, wherein the first filter is configured to pass light in a first wavelength range, and wherein the second filter is configured to pass light in a second wavelength range different from the first filter.

10. The sensor of claim 1, wherein the light-absorbing material rests on said surface.

11. The sensor of claim 1, wherein the light-absorbing material is flush with said surface.

12. The sensor of claim 1, wherein the metal plate comprises an opening vertically above each of the first and second photodiodes.

13. The sensor of claim 1, wherein the first multilayer interference filter comprises a stack of layers made of one or more of a dielectric material and a metal material.

14. A light sensor, comprising:
a first photodiode;
a second photodiode which is neighboring the first photodiode, wherein the first and second photodiodes are separated from each other by a space;
a semiconductor substrate having the first and second photodiodes arranged therein;
an interconnection structure resting on said semiconductor substrate;
a light-absorbing material positioned vertically above said space;
a first multilayer interference filter having a first central portion positioned vertically above the first photodiode and a first peripheral portion positioned vertically above said space and at least partly resting on top of and in contact with said light-absorbing material;
wherein the first central portion of the first multilayer interference filter rests on a surface of the light sensor intended to receive light, the first photodiode being arranged under said surface;
wherein said surface is on a side of the interconnection structure opposite to the semiconductor substrate; and
wherein the interconnection structure comprises a metal plate extending at least under and in contact with the light-absorbing material.

15. The sensor of claim 14, wherein the light-absorbing material is black-colored.

16. The sensor of claim 14, wherein the light-absorbing material is a black resin.

17. The sensor of claim 14, wherein the light-absorbing material absorbs at least 50% of the light power received for wavelengths in the range from 300 nm to 3 µm.

18. The sensor of claim 14, wherein the light-absorbing material absorbs at least 75% the light power received for wavelengths in the range from 300 nm to 3 µm.

19. The sensor of claim 14, wherein the light-absorbing material absorbs at least 95% of the light power received for wavelengths in the range from 300 nm to 3 µm.

20. The sensor of claim 14, comprising a second multilayer interference filter having a second central portion vertically above the second photodiode and a second peripheral portion at least partly resting on top of and in contact with the light-absorbing material.

21. The sensor of claim 20, wherein the first filter is configured to pass light in a first wavelength range, and wherein the second filter is configured to pass light in a second wavelength range different from the first filter.

22. The sensor of claim 14, wherein the light-absorbing material is flush with said surface.

23. The sensor of claim 14, wherein the metal plate comprises an opening vertically above each of the first and second photodiodes.

24. The sensor of claim 14, wherein the first multilayer interference filter comprises a stack of layers made of one or more of a dielectric material and a metal material.

* * * * *